(12) United States Patent
Nishino et al.

(10) Patent No.: US 10,381,319 B2
(45) Date of Patent: Aug. 13, 2019

(54) CORE MATERIAL, SEMICONDUCTOR PACKAGE, AND FORMING METHOD OF BUMP ELECTRODE

(71) Applicant: Senju Metal Industry Co., Ltd., Tokyo (JP)

(72) Inventors: Tomoaki Nishino, Tokyo (JP); Shigeki Kondo, Tochigi (JP); Takahiro Hattori, Tochigi (JP); Hiroyoshi Kawasaki, Tokyo (JP); Takahiro Roppongi, Tochigi (JP); Daisuke Soma, Tochigi (JP); Isamu Sato, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/832,905

(22) Filed: Dec. 6, 2017

(65) Prior Publication Data
US 2018/0174991 A1    Jun. 21, 2018

(30) Foreign Application Priority Data

Dec. 7, 2016 (JP) .................................. 2016-237468

(51) Int. Cl.
*H01L 23/48* (2006.01)
*H01L 23/00* (2006.01)
(Continued)

(52) U.S. Cl.
CPC ............ *H01L 24/13* (2013.01); *B23K 1/0016* (2013.01); *B23K 35/0227* (2013.01);
(Continued)

(58) Field of Classification Search
CPC ... H01L 23/492; H01L 23/4924; H01L 24/13; H01L 2224/11462; H01L 2224/13111
(Continued)

(56) References Cited

U.S. PATENT DOCUMENTS 5,367,924 A * 11/1994 Henson ................ B25H 1/0028
                                                          81/462
7,745,013 B2 * 6/2010 Choe .................... B23K 35/025
                                                         228/56.3
(Continued)

FOREIGN PATENT DOCUMENTS

| CN | 101134272 A | 3/2008 |
|----|-------------|--------|
| CN | 103703168 A | 4/2014 |

(Continued)

OTHER PUBLICATIONS

Suh, et al.: "Effects of plating parameters on alloy composition and microstructure of Sn—Bi electrodeposits from methane sulphonate bath," Surface and Coatings Technology, Elsevier BV, Amsterdam, NL, 2006, vol. 200, No. 11, 2006, pp. 3527-3532.

*Primary Examiner* — Nitin Parekh
(74) *Attorney, Agent, or Firm* — The Webb Law Firm

(57) ABSTRACT

A core material including a core and a solder plating layer of a (Sn—Bi)-based solder alloy made of Sn and Bi on a surface of the core. Bi in the solder plating layer is distributed in the solder plating layer at a concentration ratio in a predetermined range of, for example, 91.7% to 106.7%. Bi in the solder plating layer is homogeneous, and thus, a Bi concentration ratio is in a predetermined range over the entire solder plating layer including an inner circumference side and an outer circumference side in the solder plating layer.

20 Claims, 5 Drawing Sheets

(51) Int. Cl.

| | |
|---|---|
| *B23K 35/26* | (2006.01) |
| *C22C 12/00* | (2006.01) |
| *C22C 13/02* | (2006.01) |
| *H05K 3/34* | (2006.01) |
| *B23K 1/00* | (2006.01) |
| *B23K 35/02* | (2006.01) |
| *C25D 3/60* | (2006.01) |
| *C25D 5/10* | (2006.01) |
| *C25D 5/12* | (2006.01) |
| *C25D 7/00* | (2006.01) |
| *B23K 101/40* | (2006.01) |
| *B22F 1/00* | (2006.01) |
| *B22F 1/02* | (2006.01) |
| *C22C 5/00* | (2006.01) |
| *C22C 9/00* | (2006.01) |

(52) U.S. Cl.
CPC .......... *B23K 35/0244* (2013.01); *B23K 35/26* (2013.01); *B23K 35/262* (2013.01); *B23K 35/264* (2013.01); *C22C 12/00* (2013.01); *C22C 13/02* (2013.01); *C25D 3/60* (2013.01); *C25D 5/10* (2013.01); *C25D 5/12* (2013.01); *C25D 7/00* (2013.01); *H01L 24/11* (2013.01); *H05K 3/34* (2013.01); *B22F 1/0003* (2013.01); *B22F 1/025* (2013.01); *B22F 2999/00* (2013.01); *B23K 2101/40* (2018.08); *C22C 5/00* (2013.01); *C22C 9/00* (2013.01); *H01L 2224/11462* (2013.01); *H01L 2224/11849* (2013.01); *H01L 2224/1312* (2013.01); *H01L 2224/1316* (2013.01); *H01L 2224/1317* (2013.01); *H01L 2224/1318* (2013.01); *H01L 2224/13109* (2013.01); *H01L 2224/13111* (2013.01); *H01L 2224/13113* (2013.01); *H01L 2224/13116* (2013.01); *H01L 2224/13117* (2013.01); *H01L 2224/13118* (2013.01); *H01L 2224/13123* (2013.01); *H01L 2224/13124* (2013.01); *H01L 2224/13138* (2013.01); *H01L 2224/13139* (2013.01); *H01L 2224/13144* (2013.01); *H01L 2224/13147* (2013.01); *H01L 2224/13149* (2013.01); *H01L 2224/13155* (2013.01); *H01L 2224/13157* (2013.01); *H01L 2224/13166* (2013.01); *H01L 2224/13169* (2013.01); *H01L 2224/13171* (2013.01); *H01L 2224/13179* (2013.01); *H01L 2224/13561* (2013.01); *H01L 2224/13582* (2013.01); *H01L 2224/13611* (2013.01); *H01L 2224/13613* (2013.01); *H01L 2224/13655* (2013.01); *H01L 2224/13657* (2013.01); *H01L 2924/014* (2013.01); *H01L 2924/01014* (2013.01); *H01L 2924/01032* (2013.01); *H01L 2924/01057* (2013.01); *H01L 2924/3841* (2013.01)

(58) Field of Classification Search
USPC .................................................. 257/772, 737
See application file for complete search history.

(56) References Cited

U.S. PATENT DOCUMENTS

| | | | |
|---|---|---|---|
| 8,920,934 B2* | 12/2014 | Jiang ................. | H01L 23/49816 257/772 |
| 2005/0093164 A1* | 5/2005 | Standing ................. | H01B 1/02 257/772 |
| 2007/0170586 A1* | 7/2007 | Lee .................... | H01L 23/49816 257/737 |
| 2013/0087912 A1* | 4/2013 | Shimizu ............ | H01L 23/49816 257/737 |
| 2016/0172322 A1* | 6/2016 | Shimizu ................. | H01L 24/05 257/737 |
| 2016/0368105 A1 | 12/2016 | Hattori et al. | |
| 2017/0312860 A1 | 11/2017 | Hattori et al. | |

FOREIGN PATENT DOCUMENTS

| | | |
|---|---|---|
| JP | 200369205 A | 3/2003 |
| JP | 200744718 A | 2/2007 |
| JP | 200746087 A | 2/2007 |
| JP | 2007081141 A | 3/2007 |
| JP | 2012151105 A | 8/2012 |
| JP | 201330485 A | 2/2013 |
| JP | 5367924 B1 | 12/2013 |
| JP | 5585751 B1 | 9/2014 |
| JP | 5829905 B2 | 10/2015 |
| KR | 1020130133097 A | 12/2013 |
| WO | 2006004809 A1 | 1/2006 |
| WO | 2013141166 A1 | 9/2013 |
| WO | 2015068685 A1 | 5/2015 |
| WO | 2016071971 A1 | 5/2016 |

* cited by examiner

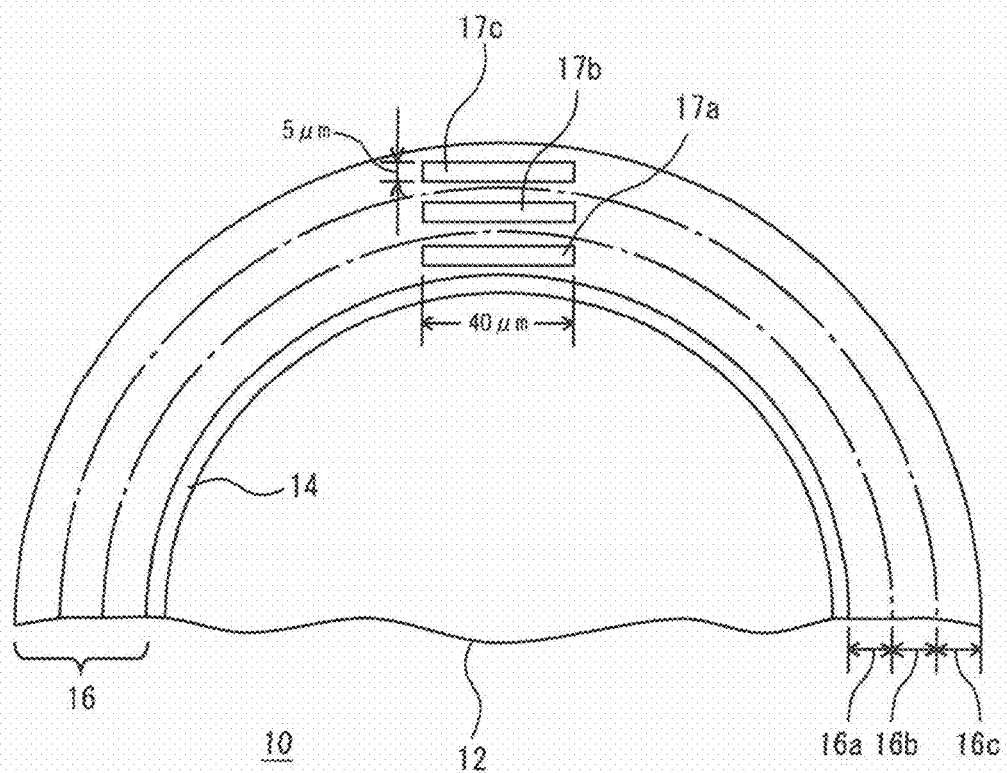

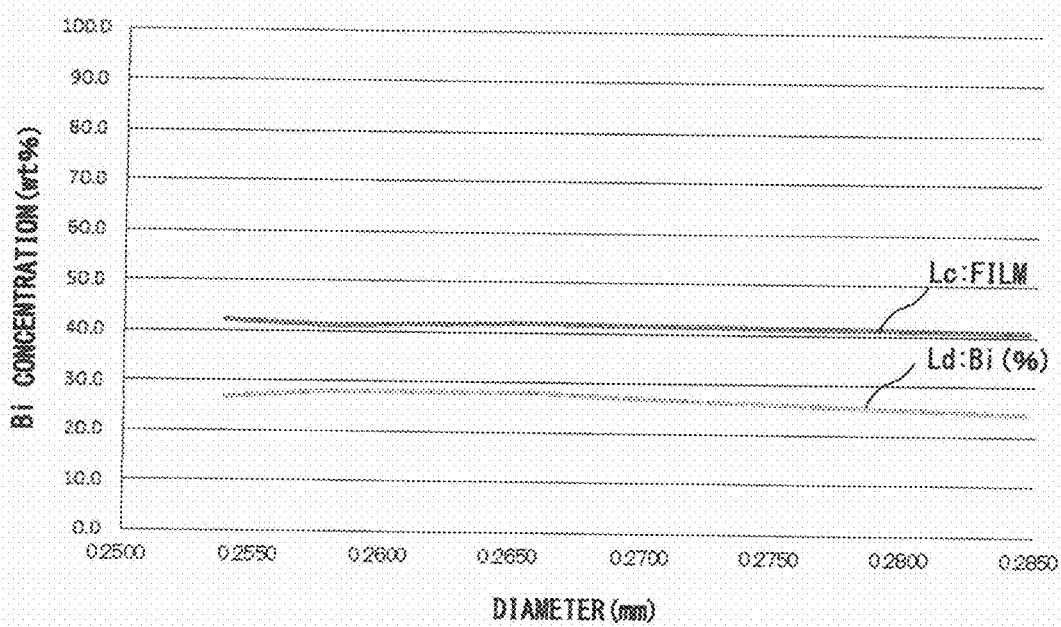

CORE MATERIAL, SEMICONDUCTOR PACKAGE, AND FORMING METHOD OF BUMP ELECTRODE

CROSS REFERENCE TO RELATED APPLICATION

The present invention contains subject matter related to Japanese Patent Application JP 2016-237468 filed in the Japanese Patent Office on Dec. 7, 2016, the entire contents of which being incorporated herein by reference.

TECHNICAL FIELD

The present invention relates to a core material, a semiconductor package including a solder bump using this core material, and a method of forming a bump electrode.

BACKGROUND ART

Recently, miniaturization in an electronic component to be mounted has been rapidly advanced according to development in small information equipment. In order to cope with narrowing of a connection terminal or reduction of a mounting area according to a demand of the miniaturization, a ball grid array (BGA) in which electrodes are disposed on a rear surface thereof has been applied to the electronic component.

The electronic component, to which the BGA is applied, for example, is a semiconductor package. The semiconductor package is configured by sealing a semiconductor chip including electrodes with resin. A solder bump is formed on each of the electrodes of the semiconductor chip. The solder bump is formed by allowing a solder ball to adhere to the electrode of the semiconductor chip. The semiconductor package, to which the BGA is applied, is mounted on a printed circuit board by allowing the solder bump fused by heating to adhere to a conductive land of the printed circuit board. Recently, in order to further cope with a demand of high density packaging, three-dimensional high density packaging in which the semiconductor packages are stacked in a height direction, has also been developed.

The semiconductor package, to which the three-dimensional high density packaging is applied, is a BGA. When the solder ball is mounted on each of the electrodes of the semiconductor chip and a reflow process is performed thereon, there may be a case where the solder ball is crushed due to the weight of the semiconductor package itself. In such a case, the solder may protrude from the electrode, and the electrodes are in contact with each other, and thus, there may be a concern that a short circuit between the electrodes occurs.

In order to prevent such a short circuit, a solder bump has been proposed in which a solder ball is not crushed by the weight of the semiconductor package itself or is not deformed at the solder melting time. Specifically, it has been proposed that a core material in which a ball molded with metal or resin is used as a core and the core is covered with a solder, is used as a solder bump.

A lead-free solder containing Sn as a main ingredient has been often used as a solder plating layer covering the core. An Sn-based solder alloy made of Sn and Bi is exemplified as a preferred example (see Japanese Patent Application Publication No. 2007-44718 and Japanese Patent No. 5367924).

In a core material disclosed in Japanese Patent Application Publication No. 2007-44718, a Cu ball is used as a metal, the Cu ball is used as a core, and an Sn-based solder alloy made of Sn and Bi is formed on the surface of the core as a solder plating layer. Since the Sn-based solder alloy containing Bi has a comparatively low melting point of 130° C. to 140° C., it is used as a plating composition from a reason that a thermal stress on a semiconductor package is small.

In Japanese Patent Application Publication No. 2007-44718, a plating treatment is performed in a concentration gradient where the content of Bi contained in the solder plating layer decreases as being directed towards an inner side (an inner circumference side) and increases as being directed towards an outer side (an outer circumference side).

From the same reason as that of Japanese Patent Application Publication No. 2007-44718, Japanese Patent No. 5367924 discloses a solder bump in which a Cu ball is used as a core, and the core is plated with an Sn-based solder alloy made of Sn and Bi. In Japanese Patent No. 5367924, a plating treatment is performed in a concentration gradient where the content of Bi contained in a solder plating layer increases as being directed towards an inner side (an inner circumference side) and decreases as being directed towards an outer side (an outer circumference side).

In a technology of Japanese Patent No. 5367924, the concentration gradient is completely opposite to that of Japanese Patent Application Publication No. 2007-44718. It is considered that this is because concentration control in Japanese Patent No. 5367924 is simpler than that of Japanese Patent Application Publication No. 2007-44718, and thus, manufacturing thereof is easily performed.

Problems to be Solved by the Invention

However, in Japanese Patent Application Publication No. 2007-44718 and Japanese Patent No. 5367924, when the core material in which the Sn-based solder alloy made of Sn and Bi is plated and coated on the surface of the Cu ball, is mounted on each of the electrodes of the semiconductor chip, and the reflow process is performed thereon, the following issues may occur.

In the technology disclosed in Japanese Patent Application Publication No. 2007-44718, the solder plating layer has the concentration gradient in which the Bi concentration decreases as being directed towards the inner circumference side and increases as being directed towards the outer circumference side, but in such a case of the concentration gradient (the inner side is thin, and the outer side is thick), there may be a concern that a Bi melting timing is slightly shifted on the inner circumference side and the outer circumference side.

In a case where there is a shift in the melting timing, a partial dissolution co-exists in which melting has not occurred yet in a region on an inner circumferential surface side even in a case where an outer surface of the core material starts to be melted, and as a result thereof, a slight positional shift of the core material occurs on a side where the core material is melted. In the high density packaging with a narrow pitch, there may be a concern that a solder treatment becomes a critical defect due to such a positional shift.

In Japanese Patent No. 5367924, the Bi concentration gradient is contrary to that of Japanese Patent Application Publication No. 2007-44718. In this case, heating is performed by reflow to connect the semiconductor package. In Japanese Patent No. 5367924, when the melting by heating is performed in a state where the Bi concentration in the solder plating layer increases as being directed towards the inner circumference side and decreases as being directed towards the outer circumference side, a Bi density is high on the inner circumference side, so that a solder starts to be melted from a Bi region on the inner circumference side. Even in a case where the Bi region on the inner circumference side is melted, a Bi region on the outer circumference side has not yet started to be melted, and thus, volume expansion may quickly occur on the Bi region side on the inner circumference side.

A pressure difference may occur between the inner circumference side and the outer circumference side (external air) of Bi according to an occurring timing of the volume expansion on the inner and outer circumference sides. When the outer circumference side of Bi starts to be melted, the Cu ball, which is the core, may be flicked off by a pressure difference due to the volume expansion on the inner circumference side. Such a situation must avoid occurring.

Thus, a defect may occur in a Cu core ball including a solder plating layer which is formed of an Sn-based solder alloy made of Sn and Bi, in a case where Bi in the solder plating layer has a concentration gradient.

The present invention addresses the above-described issues and has an object to provide a core material including a core and an electric solder plating layer formed by performing electric plating with respect to a surface of the core with an (Sn—Bi)-based solder alloy made of Sn and Bi, in which Bi contained in the solder plating layer is distributed in the solder plating layer at a concentration ratio in a predetermined range of 91.4% to 106.7%. In other words, by setting the concentration ratio of Bi to be in the predetermined range, the core material in which the Bi concentration in the solder plating layer becomes homogeneous (equable), and a Bi concentration ratio is in a predetermined range over the entire region including an inner layer, an interlayer, and an outer layer of the solder plating layer, and a semiconductor package using the core material are provided.

Here, in a case where a base plating layer subjected to Ni plating or the like is provided between the core and the solder plating layer of the (Sn—Bi)-based solder alloy, a core material is provided in which Bi is homogeneously distributed in the solder plating layer excluding the base plating layer.

In addition, a semiconductor package including a bump using such a core material is provided.

Furthermore, the Bi concentration ratio (%) used herein indicates a percentage (%) of a ratio of a measured value of Bi (mass %) to a target Bi content (mass %), or an average value of the measured values (mass %) of Bi to the target Bi content (mass %), in a predetermined region of the solder plating layer.

In addition, it is possible to restate the Bi content in a predetermined region as the Bi concentration in the predetermined region, and thus, the Bi concentration ratio (%) used herein indicates a percentage (%) of a ratio of the measured Bi concentration to the target Bi concentration, or a ratio (%) of the average of the measured Bi concentration to the target Bi concentration, in the predetermined region of the solder plating layer.

Furthermore, the Bi content in the solder plating layer can be measured by using a known analysis method such as ICP-AES or ICP-MS in which the solder plating layer is dissolved by using an oxoacid or the like as the core material.

Means for Solving the Problem

In order to attain the object described above, a core material according to this invention contains a core and an electric solder plating layer of an (Sn—Bi)-based solder alloy made of Sn and Bi on a surface of the core, the electric solder plating layer being subjected to electric solder plating, characterized in that the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more types thereof, a metal oxide thereof, or a metal mixed oxide thereof, and when a concentration ratio of Bi contained in the solder plating layer is set to Concentration Ratio (%)=(Measured Value of Bi(mass %)/Target Bi Content (mass %))*100, or Concentration Ratio (%)=(Average Value of Measured Values of Bi (mass %)/Target Bi Content (mass %)*100, the concentration ratio is in a range of 91.4% to 106.7%.

A core material according to this invention contains a core and an electric solder plating layer of an (Sn-58Bi)-based solder alloy made of Sn and Bi in amount of 58 mass % on a surface of the core, the electric solder plating layer being subjected to electric solder plating, characterized in that the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more types thereof, a metal oxide thereof, or a metal mixed oxide thereof, and when a concentration ratio of Bi contained in the solder plating layer is set to Concentration Ratio (%)=(Measured Value of Bi (mass %)/Target Bi Content (mass %))*100, or Concentration Ratio (%)=(Average Value of Measured Values of Bi (mass %)/Target Bi Content (mass %))*100, the concentration ratio is in a range of 91.4% to 108.6%. Here, the term, (Sn-58Bi) is referred to as (Sn-58 weight % Bi).

A core material according to this invention contains a core, and an electric solder plating layer of an (Sn-40Bi)-based solder alloy made of Sn and Bi in amount of 40 mass % on a surface of the core, the electric solder plating layer being subjected to electric solder plating, characterized in that the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more types thereof, a metal oxide thereof, or a metal mixed oxide thereof, and when a concentration ratio of Bi contained in the solder plating layer is set to Concentration Ratio (%)=(Measured Value of Bi (mass %)/Target Bi Content (mass %))*100, or Concentration Ratio (%)=(Average Value of Measured Values of Bi (mass %)/Target Bi Content (mass %))*100, the concentration ratio is in a range of 90% to 107.5%. Here, the term, (Sn-40Bi) is referred to as (Sn-40 weight % Bi).

A core material according to this invention contains a core, and an electric solder plating layer of an (Sn-3Bi)-based solder alloy formed of Sn and Bi in amount of 3 mass % on a surface of the core, the electric solder plating layer being subjected to electric solder plating, wherein the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more types thereof, a metal oxide thereof, or a metal mixed oxide thereof, and when a concentration ratio of Bi contained in the solder plating layer is set to Concentration Ratio (%)=(Measured Value of Bi (mass %)/Target Bi Content (mass %))*100, or Concentration Ratio (%)=(Average Value of Measured Values of Bi (mass %)/Target Bi Content (mass %))*100, the concentration ratio is in a range of 90% to 106.7%. Here, the term, Sn-3Bi) is referred to as (Sn-3 weight % Bi).

A core material according to this invention is a core material as described above, characterized in that the core material further includes a base plating layer of one or more elements selected from the group of Ni and Co, between the surface of the core and the electric solder plating layer in this order.

A core material according to this invention is a core material described above, characterized in that a Cu ball is used as the core.

A core material according to this invention is a core material described above, characterized in that a Cu column is used as the core.

A semiconductor package according to this invention is a semiconductor package characterized in that the core material according to the invention is used.

A method of forming a bump electrode according to this invention is a method characterized in that the method contains the steps of mounting on an electrode a core material including a core and an electric solder plating layer of an (Sn—Bi)-based solder alloy made of Sn and Bi on a surface of the core, the electric solder plating layer being subjected to electric solder plating, in which the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more types thereof, a metal oxide thereof, or a metal mixed oxide thereof, and when a concentration ratio of Bi contained in the solder plating layer is set to Concentration Ratio (%)=(Measured Value of Bi (mass %)/Target Bi Content (mass %))*100, or Concentration Ratio (%)=(Average Value of Measured Values of Bi (mass %)/Target Bi Content (mass %))*100, the concentration ratio is in a range of 91.4% to 106.7%; and forming the bump electrode by heating the mounted core material.

A treatment is performed such that a concentration distribution of Bi in the solder plating layer is homogeneous from an inner circumference side towards an outer circumference side and over the entire region including the inner circumference side and the outer circumference side, through a plating thickness (here, in a case where the base plating layer of Ni plating or the like is disposed on the core, the base plating layer is excluded).

The Sn-based solder alloy is capable of containing an additive element other than the (Sn—Bi)-based solder alloy. Examples of an element which can be added to the (Sn—Bi)-based solder alloy include one type or two or more types of elements of Ag, Cu, Ni, Ge, Ga, In, Zn, Fe, Pb, Sb, Au, Pd, Co, and the like. For example, an (Sn—Bi—Cu—Ni)-based solder alloy, an (Sn—Ag—Cu—Bi)-based solder alloy, or the like is considered.

The core material is a core material in which the (Sn—Bi)-based solder alloy made of Sn and Bi is plated on the surface of the core by electric solder plating and Bi in the solder plating layer is distributed in the solder plating layer at a concentration ratio in a predetermined range of, for example, 91.4% to 106.7%. The concentration ratio (%) will be described below.

Effect of the Invention

According to the core material of the present invention, Bi in the electric solder plating layer is homogeneous, and thus, the Bi concentration ratio is in a predetermined range over the entire region including the inner circumference side and the outer circumference side of Bi, through a film thickness of the solder plating layer. For this reason, any situation does not occurs in which the inner circumference side is melted earlier than the outer circumference side, and a volume expansion difference occurs between the inner circumference side and the outer circumference side, and thus, the core material is flicked off.

In addition, Bi in the electric solder plating layer is homogeneous, and thus, the entire surface of the core material is approximately homogeneously melted, and therefore, a temporal difference in a melting timing rarely occurs in the solder plating layer. As a result thereof, a positional shift of the core material due to a shift in the melting timing does not occur, and thus, there is no concern of a short circuit between the electrodes or the like due to the positional shift or the like. Therefore, it is possible to provide a high-quality semiconductor package by using the core material. Here, in the present invention, an issue of the electric solder plating in which a film thickness can be homogeneously controlled, but a concentration become inhomogeneous, can be addressed such that the Bi concentration ratio is set to be in a predetermined range, and thus, a core material including a homogeneous electric solder plating layer can be obtained.

Other objects and attainments of the present invention will be become apparent to those skilled in the art upon a reading of the following detailed description when taken in conjunction with the drawings.

BRIEF DESCRIPTION OF DRAWINGS

FIG. 7 is an explanatory diagram illustrating an example of a method of measuring a concentration distribution of Bi of a core material.

FIG. 8 is a characteristic curve diagram when a relationship between a Bi concentration in a plating liquid and a Bi concentration contained in a solder plating layer in an electric plating treatment of Embodiment 2 is set on the basis of a Cu core ball diameter.

DESCRIPTION OF THE INVENTION

Figure 1:
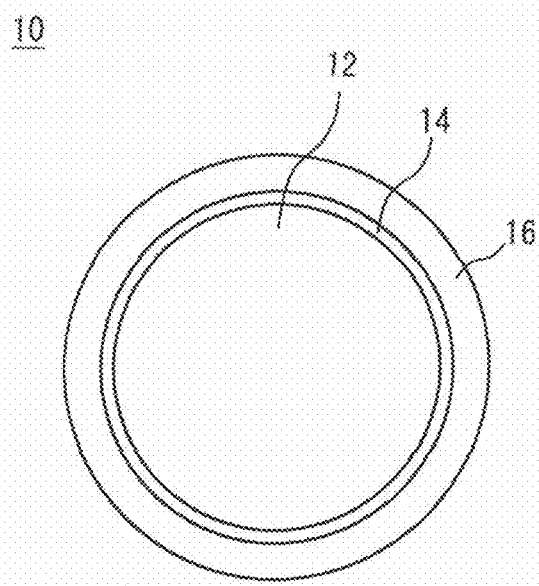
FIG. 1 is a sectional view illustrating a configuration example of a Cu core ball according to one embodiment of the present invention.

The following will describe preferred embodiments of the present invention in detail.

In the present invention, the core material in which the Sn-based solder alloy made of Sn and Bi is plated on the surface of the core by an electric plating treatment and Bi is homogeneously distributed in the solder plating layer, and the semiconductor package using the core material are provided.

The solder plating layer of the present invention has composition of an (Sn—Bi)-based alloy containing Sn and Bi. In a case where the amount of Bi is in a range of 0.1 mass % to 99.9 mass % with respect to the entire alloy, the content of Bi can be controlled such that a concentration ratio of Bi is in a predetermined range of 91.4% to 106.7%, and Bi can be homogeneously distributed in the solder plating layer.

For example, in a case of an (Sn-58Bi)-based solder alloy, in the distribution of Bi, a target value is 58 mass %, and an allowable range is 52 mass % (a concentration ratio of 91.4%) to 63 mass % (a concentration ratio of 108.6%).

Furthermore, the allowable range is referred to as a range where soldering such as bump formation can be performed without any problem insofar as being in the range described above. In addition, the concentration ratio (%) is referred to as a percentage (%) of a ratio of measured value (mass %) with respect to a target content (mass %), or a percentage (%) of a ratio of an average value (mass %) of the measured values to the target content (mass %). That is, the concentration ratio (%) can be represented as:

Concentration Ratio (%)=(Measured Value (mass %)/Target Content (mass %))*100; or Concentration Ratio (%)=(Average Value of Measured Values (mass %)/Target Content (mass %))*100.

In addition, even in a case where any other additive elements are added to a two-dimensional electric solder plating layer made of Sn and Bi, it is possible to control the concentration ratio of Bi such that the concentration ratio of Bi is in a predetermined range of 91.4% to 106.7%.

It is considered that one type or two or more types of Ag, Cu, Ni, Ge, Ga, In, Zn, Fe, Pb, Sb, Au, Pd, Co, and the like are used as the additive element.

A metal material is used as the core. A spherical body and other shapes (a columnar column, a sheet, or the like) are considered as the shape of the core. In this embodiment, a case of a Cu core ball, which is a spherical body, and in particular, uses a ball made of Cu (hereinafter, referred to as a Cu ball) as the core, will be described.

A particle diameter (a spherical diameter) of the Cu ball is different according to a size of the BGA or the like, but in the following embodiments, the Cu ball is a sphere having a diameter of approximately 200 μmϕ, and the thickness of the solder plating layer on one side in a radial direction is 20 μm to 100 μm. A particle diameter of the Cu core ball is suitably selected according to the density of electronic components to be used or the size thereof, and thus, it is possible to use a Cu ball in a range of 1 μm to 1000 μm, and a plating thickness is suitably selected according to the particle diameter of the Cu ball to be used. An electric plating device is used as a plating device of performing a plating treatment.

Subsequently, an example of the Cu core ball using the Cu ball will be described.

FIG. 1 is a sectional view illustrating an example of the Cu core ball 10 according to the present invention. For convenience of explanation, the drawings are exaggeratingly illustrated.

Figure 2:
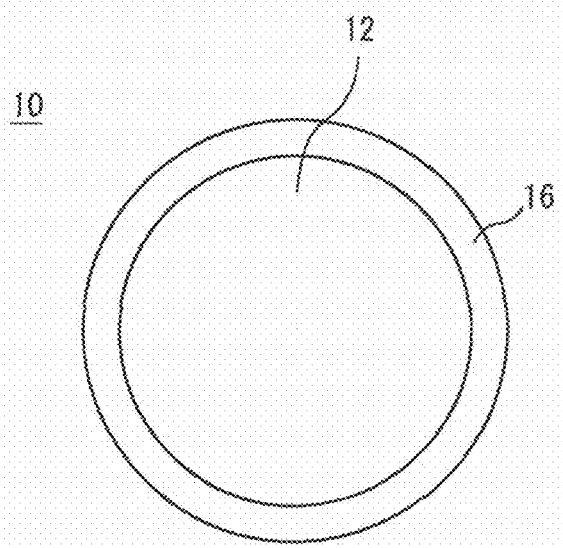
FIG. 2 is a sectional view illustrating a configuration example of a Cu core ball according to another embodiment of the present invention.

The Cu core ball 10 includes a Cu ball 12, and in this example, a solder plating layer 16 formed of an Sn-based solder alloy, which is formed through an Ni base plating layer 14. The Ni base plating layer 14 functions as base plating for preventing a composition change in the solder plating layer 16 due to metallic diffusion between the Cu ball 12 and the solder plating layer 16. The Ni base plating layer 14 has a thickness of approximately 1 μm to 4 μm. The Ni base plating layer 14 is not an essential requirement, but as illustrated in FIG. 2, the solder plating layer can be directly formed on the surface of the Cu ball 12. Furthermore, in a case of forming the base plating layer 14, the base plating layer 14 may be configured of a layer including one or more elements selected from Ni and Co.

Cu to be used in the Cu ball 12 may be pure copper, or may be a copper alloy.

In a case of using the Cu ball 12 having an alloy composition in which Cu is a main ingredient, the purity thereof is not particularly limited, but is preferably greater than or equal to 99.9 mass % from the viewpoint of suppressing degradation of an electric conductance or a thermal conductivity of the Cu core ball due to a decrease in the purity, and as necessary, of suppressing α dose.

The core may be configured of a metal simple substance of Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more types thereof, a metal oxide thereof, or a metal mixed oxide thereof, other than Cu.

The Cu ball 12 preferably has a sphericity of greater than or equal to 0.95, and more preferably has the sphericity of greater than or equal to 0.990, from the viewpoint of controlling a stand-off height. When the sphericity of the Cu ball 12 is less than 0.95, the Cu ball 12 has an undefined shape, and thus, a bump having an uneven height is formed at the time of forming the bump. This may result in any possibility in which an adhesive defect occurs. Further, when the Cu core ball 10 is mounted on an electrode and is subjected to reflow, the Cu core ball 10 may cause a positional shift in a case where the sphericity thereof is low, and thus, self-alignment properties may be also degraded.

Here, the sphericity indicates a shift from a true sphere. The sphericity is obtained by various methods such as a least square center method (an LSC method), a minimum zone center method (an MZC method), a maximum inscribed center method (an MIC method), and a minimum circumscribed center method (an MCC method). Specifically, the sphericity is an arithmetic average value which is calculated at the time of dividing the diameter of each of 500 Cu balls by a long diameter thereof, and indicates that it is close to a true sphere as the value is closer to 1.00, which is the upper limit. The length of the long diameter indicates a length which is measured by a ULTRA QV350-PRO measurement device (an ultra quick vision, manufactured by Mitutoyo Corporation).

It is preferable that the entire diameter of the Cu core ball 10 including the solder plating layer 16 is 1 μm to 1000 μm. According to such a range, it is possible to stably manufacture the spherical Cu core ball 10, and by selecting the particle diameter, it is possible to suppress a connection short circuit when there is a narrow pitch between electrode terminals.

There is a case where an aggregate of Cu core balls 10 having a particle diameter of approximately 1 μm to 300 μm is referred to as a "Cu core powder". There is a case where the Cu core powder is used in a state of being mixed as solder powder in a solder paste.

The solder plating layer 16 is formed of a solder alloy, and in this case, is made of Sn and Bi.

In this case, as described above, it is preferable that a Bi content in the solder plating layer 16 is approximately 53 mass % (a concentration ratio of 91.4%) to 63 mass % (a concentration ratio of 108.6%) with respect to 58 mass % of a target value, as an allowable range.

The thickness of the solder plating layer 16 is different according to the particle diameter of the Cu ball 12, and is preferably less than or equal to 100 μm on one side in the radial direction. For example, the solder plating layer 16 is formed to have a thickness of 50 μm to 70 μm when the Cu ball 12 has a particle diameter of 215 μmφ. This is because a sufficient solder adhesive amount is ensured.

A mixed liquid of an organic acid, methane sulfonic acid Bi, and a surfactant is used as plating liquid. The concentration of the plating liquid is controlled such that the concentration is constant while the solder plating layer is formed.

When a solder plating layer having a composition of the Sn—Bi-based solder alloy made of Sn and Bi is formed by electric plating, Bi is introduced into the solder plating layer prior to Sn, and thus, there may be a problem that the Bi concentration in the electric plating liquid is not coincident with the amount of Bi in the solder plating layer. Accordingly, it is not capable of forming a solder alloy plating layer having a homogeneous concentration distribution of Bi. Therefore, as shown in a condition of FIG. 6, an electric plating treatment is performed such that a predetermined direct current voltage is applied between an anode electrode and a cathode electrode, and a Bi concentration in the liquid is adjusted to be homogeneous while oscillating the Cu balls.

Figure 6:
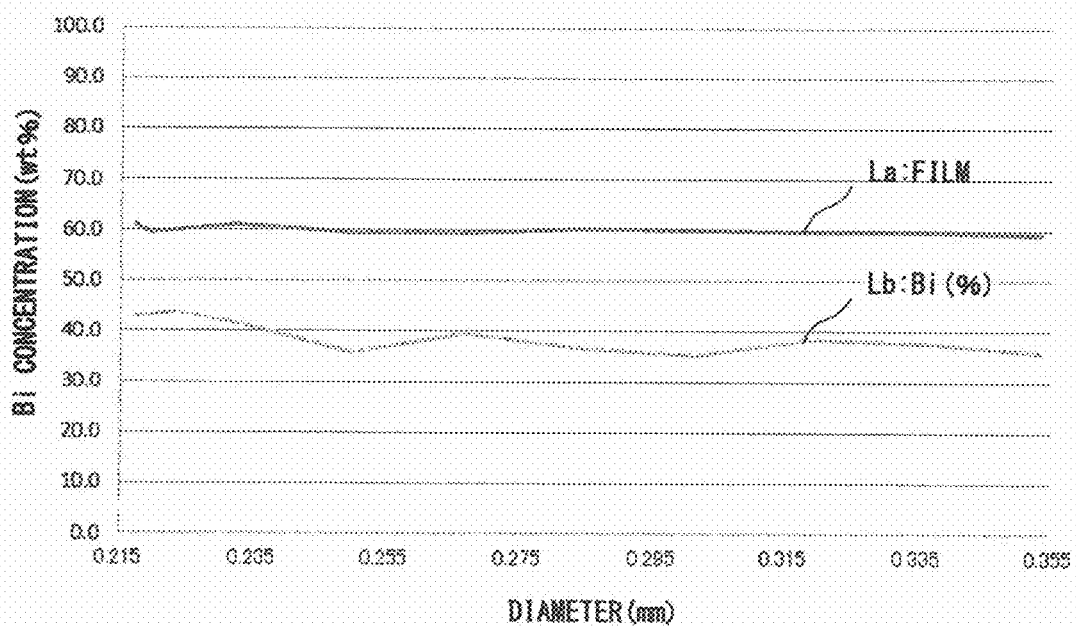
FIG. 6 is a characteristic curve diagram when a relationship between a Bi concentration in a plating liquid and a Bi concentration contained in a solder plating layer in an electric plating treatment of Embodiment 1 is set on the basis of a Cu core ball diameter.

The following will describe a formation process of the solder plating layer 16 according to this plating treatment more in detail with reference to FIG. 6. FIG. 6 is a characteristic curve diagram when a relationship between the Bi concentration (a curve Lb) in a plating liquid and a Bi concentration (a curve La) contained in a solder plating layer 16 in an electric plating treatment is set on the basis of a Cu core ball diameter.

In this embodiment, a particle diameter of 215 μm was used as an initial value of the Cu ball. The thickness of the solder plating layer 16 was monitored one by one, and in this embodiment, the Cu core ball 10 when the thickness of the solder plating layer 16 gradually increases by a predetermined value was sampled as samples at each time. The sampled samples were washed, and dried, and then, particle diameters thereof were measured.

In a case where the contents of Bi in the solder plating layer were gradually measured when the particle diameters of the Cu core balls at measured timings were a target value, a result as illustrated by the curve La of FIG. 6 was obtained. From the result, it is determined that the contents of Bi even when the solder plating layer 16 gradually increases by a predetermined thickness are approximately the same value as the last content. In a case of the curve La, the content of Bi is approximately 58 mass % to 60 mass %. Accordingly, from the curve La of FIG. 6, it is possible to understand that the concentration distribution of Bi is homogeneous (equable) with respect to the plating thickness, and there is no concentration gradient.

Figure 3:
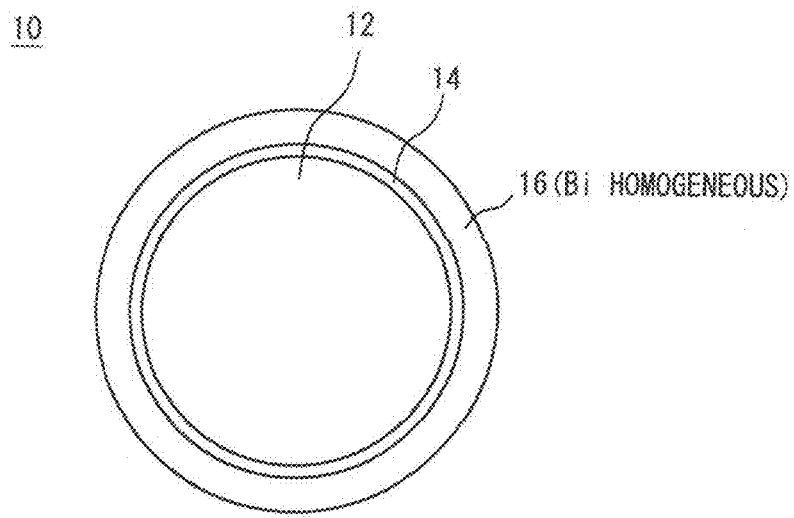
FIG. 3 is an enlarged sectional view illustrating a configuration example of a Cu core ball and illustrating a Bi distribution state in a solder plating layer.
Figure 4:
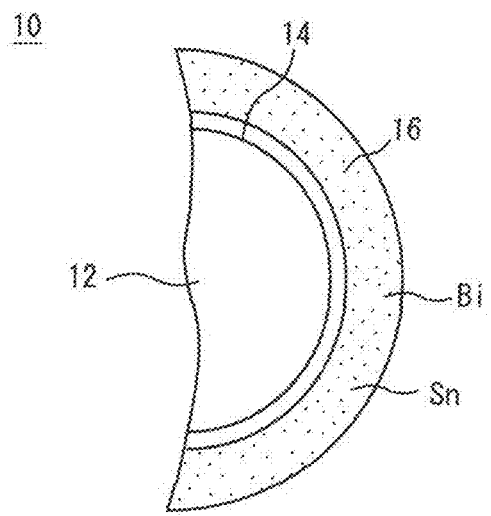
FIG. 4 is a further enlarged sectional view of FIG. 3.
Figure 5:
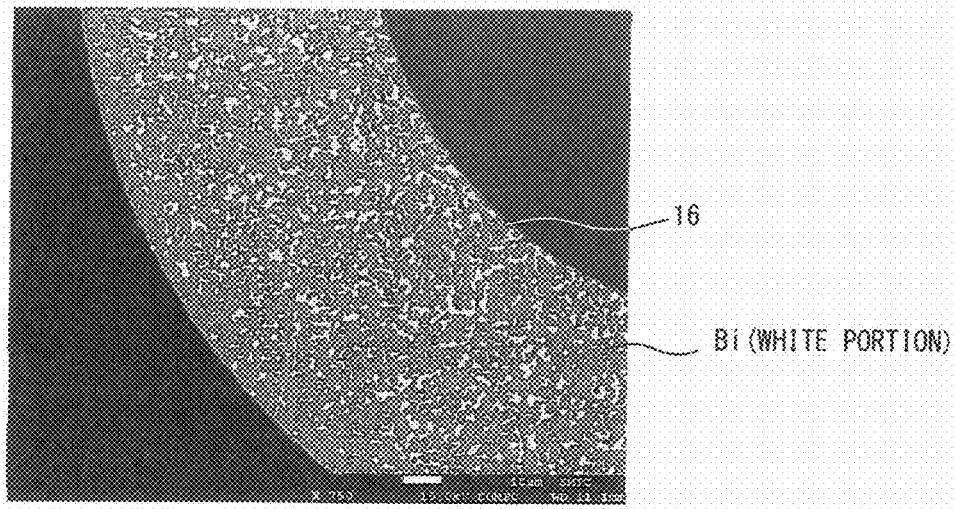
FIG. 5 is a sectional view of main parts enlargedly illustrating a distribution state of Sn and Bi (a field emission electron probe micro analyzer (FE-EPMA) picture).

FIG. 3 illustrates a sectional view of the Cu core ball 10 at this time. As it is obvious from FIG. 4 enlargedly illustrating FIG. 3, and FIG. 5 more enlargedly illustrating FIG. 4, a process is clearly understood in which Sn and Bi are grown while homogeneously co-existing in the solder plating layer 16. FIG. 5 shows a picture captured by using an FE-EPMA.

It is obvious that Bi in the solder plating layer 16 is grown (precipitated) in a state of being approximately homogeneously distributed from the fact that the concentration of Bi in the solder plating layer 16 is maintained approximately in the same state even in a case where the thickness of the solder plating layer 16 is grown. The plating treatment is performed in a state where the Bi concentration in the plating liquid is homogeneous such that the Bi concentration falls within a predetermined value. In this embodiment, 58 mass % is set to as a target value of the content of Bi in the solder plating layer 16, and thus, the concentration of Bi in the plating liquid is controlled such that the concentration reaches the target value.

In order to allow the concentration distribution of Bi in the solder plating layer 16 to fall within an expected value, the plating treatment is performed while controlling voltage and current. It is possible to maintain the distribution of Bi in the solder plating layer 16 to be the expected value by such an electric plating treatment.

In the embodiment, the Bi concentration in the plating liquid is approximately 42 mass % to 44 mass % during the plating treatment, and as described above, this is because the plating treatment is performed while adjusting the Bi concentration in the plating liquid, as needed, such that the Bi concentration in the solder plating layer 16 is 53 mass % to 63 mass %.

The reason that the Bi concentration in the solder plating layer 16, which is illustrated by the curve La, is not coincident with the Bi concentration in the plating liquid, which is illustrated by the curve Lb, is because Bi in the plating liquid is introduced into the solder plating layer prior to Sn in the plating liquid.

In order to confirm that the concentration distribution of Bi in the solder plating layer 16 is a value corresponding to the target value, the following experiment was performed.

(1) In the following condition, the Cu core balls 10 were prepared in which the composition of the solder plating layer 16 was (Sn-58Bi).
 Diameter of each Cu ball 12: 250 μm
 Film Thickness of Ni Base Plating Layer 14: 2 μm
 Film Thickness of Solder Plating Layer 16: 23 μm
 Diameter of each Cu Core Ball 10: 300 μm In order to easily measure a result of the experiment, the Cu core balls each including a solder plating layer, the thickness of which was relatively thin, were prepared as the Cu core balls 10.

As shown in the condition of FIG. 6, the Cu core balls 10 were prepared by using an electric plating method as the plating method.

(2) Ten Cu core balls 10 in each of which a solder plating layer of an (Sn-58Bi)-based solder alloy having the same composition was formed, were prepared as samples. The Cu core balls 10 were used as the samples A.

(3) Each of the samples A1 to A10 was sealed with resin.

(4) Each of the sealed samples A1 to A10 was ground for each resin, and a sectional surface of each of the samples A1 to A10 was observed. FE-EPMAJXA-8530F, manufactured by JEOL Ltd., was used as observation equipment.

FIG. 7 illustrates a sectional view of the sample A1. For the sake of convenience, the solder plating layer 16 was partitioned into an inner layer 16a, an interlayer 16b, and an outer layer 16c from the surface side of the Cu ball 12. The inner layer 16a was set to be in a range of 9 μm from the surface of the Cu ball 12. The interlayer 16b was set to be in a range of 9 μm to 17 μm. The outer layer 16c was set to be in a range of 17 μm to 23 μm. As illustrated in FIG. 7, in this embodiment, regions 17a, 17b, and 17c each having a thickness of 5 µm and a width of 40 µm were respectively cut from the inner layer 16a, the interlayer 16b, and the outer layer 16c. The concentration of Bi in each of the regions was measured by qualitative analysis. Such an operation was performed with respect to each of the inner layer 16a, the interlayer 16b, and the outer layer 16c for each of ten visual fields in total.

A result thereof is summarized in (Table 1). According to (Table 1), it is understood that in the inner layer, the interlayer, and the outer layer, a minimum value is 53.29 mass % (a concentration ratio of 91.9%), and a maximum value is 60.97 mass % (a concentration ratio of 105.1%). Although, as described above, the allowable range of Bi has been set to be 53 mass % (a concentration ratio of 91.4%) to 63 mass % (a concentration ratio of 108.6%), from actual measured values of the result of the experiment, it is understood that the allowable range can be 53.29 mass % (a concentration ratio of 91.9%) to 60.97 mass % (a concentration ratio of 105.1%).

Then, as a result of calculating the arithmetic average of the samples A1 to A10, Inner Layer Region 17a=57.46 (mass %) (Concentration Ratio of 99.1%);

Interlayer Region 17b=56.32 (mass %) (Concentration Ratio of 97.1%); and

Outer Layer Region 17c=56.62 (mass %) (Concentration Ratio of 97.6%) were obtained.

In addition, it is understood that in each of the regions 17a to 17c of the inner layer, the interlayer, and the outer layer, Bi in the solder plating layer is in the allowable range of 53 mass % to 63 mass % described above in the arithmetic average, and thus, is approximately the concentration ratio of Bi, which is the target value.

TABLE 1

| | | | | Distribution of Bi (wt %): Actual Measured Value of Each of Ten Portions | | | | |
| | | | | Inner Layer Region (17a) | | Interlayer Region (17b) | | Outer Layer Region (17c) | |
| | Samples A | Sn-Based Solder Alloy (Cu Core Ball) | Target Value (Mass %) | Actual Measured Values (Mass %) | Concentration Ratio (%) [Actual Measured Value/Target Value (58 Mass %)] | Actual Measured Values (Mass %) | Concentration Ratio (%) [Actual Measured Value/Target Value (58 Mass %)] | Actual Measured Values (Mass %) | Concentration Ratio (%) [Actual Measured Value/Target Value (58 Mass %)] |
|---|---|---|---|---|---|---|---|---|---|
| Executed Examples | A1 | Sn—58Bi | 58 | 59.47 | 102.5 | 57.01 | 98.3 | 55.13 | 95.1 |
| | A2 | | | 60.49 | 104.3 | 60.40 | 104.1 | 57.35 | 98.9 |
| | A3 | | | 54.96 | 94.8 | 57.25 | 98.7 | 60.13 | 103.7 |
| | A4 | | | 60.97 | 105.1 | 54.96 | 94.8 | 55.16 | 95.1 |
| | A5 | | | 55.85 | 96.3 | 54.84 | 94.6 | 55.36 | 95.4 |
| | A6 | | | 57.54 | 99.2 | 54.24 | 93.5 | 54.36 | 93.7 |
| | A7 | | | 59.45 | 102.5 | 55.96 | 96.5 | 59.99 | 103.4 |
| | A8 | | | 56.05 | 96.6 | 57.75 | 99.6 | 53.29 | 91.9 |
| | A9 | | | 55.36 | 95.4 | 55.32 | 95.4 | 58.28 | 100.5 |
| | A10 | | | 54.46 | 93.9 | 55.48 | 95.7 | 57.10 | 98.4 |
| | Average Value | Sn—58Bi | 58 | 57.46 | 99.1 | 56.32 | 97.1 | 56.62 | 97.6 |

The same measurement operation applies to samples B to D prepared separately from the samples A, and a result thereof is shown in (Table-2).

TABLE 2

| | | | | | Distribution of Bi (wt %): Average Value of Each of Ten Portions | |
| | | | | | Inner Layer Region (17a) | |
| | Sample | Sn-Based Solder Alloy (Cu Core Ball) | Target Value (Mass %) | Classification | Average Value (Mass %) | Concentration Ratio (%) [Average Value/Target Value] |
|---|---|---|---|---|---|---|
| Executed Examples | A | Sn—58Bi | 58 | Homogeneous | 57.46 | 99.1 |
| | B | | | | 56.83 | 98.0 |
| | C | | | | 57.89 | 99.8 |
| | D | | | | 57.33 | 98.9 |
| | E | Sn—40Bi—0.5Cu—0.03Ni | 40 | Homogeneous | 38.46 | 96.2 |
| | F | | | | 40.12 | 100.3 |
| | G | | | | 39.11 | 97.8 |
| | H | | | | 38.88 | 97.2 |
| | I | Sn—3Ag—0.8Cu—3Bi | 3 | Homogeneous | 2.91 | 97.0 |
| | J | | | | 2.88 | 96.0 |
| | K | | | | 3.08 | 102.7 |
| | L | | | | 2.81 | 93.7 |

TABLE 2-continued

| | | Sample | | | Distribution of Bi (wt %): Average Value of Each of Ten Portions | | | |
|---|---|---|---|---|---|---|---|---|
| Comparative | 1 | | Sn—58Bi | | 58 | Inner: Thin | 0 | 0.0 |
| Examples | 2 | | Sn—58Bi | | 58 | Inner: Thick | 70.7 | 121.9 |

| | | | Interlayer Region (17b) | | Outer Layer Region (17c) | | |
|---|---|---|---|---|---|---|---|
| | | Sample | Average Value (Mass %) | Concentration Ratio (%) [Average Value/Target Value] | Average Value (Mass %) | Concentration Ratio (%) [Average Value/Target Value] | Presence or Absence of Adhesive Defect |
| Executed Examples | | A | 56.32 | 97.1 | 56.62 | 97.6 | Excellent |
| | | B | 57.12 | 98.5 | 57.75 | 99.6 | Excellent |
| | | C | 57.38 | 98.9 | 58.01 | 100.0 | Excellent |
| | | D | 56.47 | 97.4 | 57.23 | 98.7 | Excellent |
| | | E | 37.81 | 94.5 | 40.44 | 101.1 | Excellent |
| | | F | 38.98 | 97.5 | 39.32 | 98.3 | Excellent |
| | | G | 41.33 | 103.3 | 40.32 | 100.8 | Excellent |
| | | H | 38.49 | 96.2 | 39.89 | 99.7 | Excellent |
| | | I | 2.81 | 93.7 | 2.82 | 94.0 | Excellent |
| | | J | 2.97 | 99.0 | 2.93 | 97.7 | Excellent |
| | | K | 2.99 | 99.7 | 3.01 | 100.3 | Excellent |
| | | L | 2.87 | 95.7 | 2.91 | 97.0 | Excellent |
| Comparative Examples | | 1 | 52.12 | 89.9 | 100 | 172.4 | Defective (Positional Shift) |
| | | 2 | 24.8 | 42.8 | 3.8 | 6.6 | Defective (Flicking-off) |

Excellent: No Adhesive Defect
Defective (Positional Shift): Positional Shift occurred at time of Adhesion
Defective (Flicking-off): Flicking-off of Ball was confirmed at time of Adhesion From the result of (Table 2), it is understood that there is a slight variation, but the Bi concentration in the solder plating layer 16 falls within a range of 53 mass % to 63 mass %, which is the target value.

Then, ten (an example) Cu core balls manufactured in the same lot as that of the samples A to D were respectively extracted, and respectively adhered to the substrate by a general reflow process.

Adhesive results are also collectively shown in (Table 2).

In the adhesive result, a case where no adhesive defect is measured with respect to all of the samples was determined as "excellent", a case where a positional shift occurs even in one sample at the time of adhesion and the Cu core ball 10 was flicked off even in one sample at the time of adhesion was determined as "defective".

In any case, a situation did not occur in which an inner circumference side was melted earlier than an outer circumference side, a volume expansion difference occurred between the inner circumference side and the outer circumference side, and thus, the Cu core ball 10 was flicked off, and the entire solder plating layer 16 was approximately homogeneously melted. Therefore, a positional shift of the core material which was considered to occur due to a shift in the melting timing did not occur, and thus, there was no concern of a short circuit between the electrodes or the like, which was caused by the positional shift or the like. Accordingly, an excellent result without any adhesive defect was obtained, and thus, the result was determined as "excellent".

Embodiment 2

In Embodiment 2, the solder plating layer 16 of a four-dimensional Sn-based solder alloy formed of (Sn—Cu—Bi—Ni) containing Cu and Ni in addition to Sn and Bi is typically formed. A composition ratio as a target value thereof is as follows.

Bi: 40 mass %, Cu: 0.5 mass %, Ni: 0.03 mass %, and Sn: the remainder.

At this time, the distribution of Bi is 40 mass % as a target value, and is 36 mass % (a concentration value of 90%) to 43 mass % (a concentration ratio of 107.5%) as an allowable range.

Specifically, in the following condition, Cu core balls in each of which the composition of the solder plating layer was (Sn-40Bi-0.5Cu-0.03Ni) accorded to the above description were prepared.

Diameter of each Cu ball: 180 μm
Film Thickness of Ni Base Plating Layer: 2 μm
Film Thickness of Solder Plating Layer: 33 μm
Diameter of each Cu Core Ball: 250 μm A preparation method of the Cu core balls was performed such that the Bi concentration in the plating liquid was homogeneous according to the same electric plating condition as that of Embodiment 1.

The same condition as that of Embodiment 1 applied to an experiment method, except that the inner layer 16a was set to be in a range of 11 μm from the surface of the Cu ball, the interlayer 16b was set to be in a range of 11 μm to 22 μm, and the outer layer 16c was set to be in a range of 22 μm to 33 μm.

The measured results are shown as E to H in (Table 2).

From the result of samples E to H in (Table 2), it is understood that a target value of Bi in this case is 40 mass %, but Bi in the solder plating layer 16 in this case is minimally 37.81 mass % (a concentration ratio of 94.5%) to maximally 41.33 mass % (a concentration ratio of 103.3%) (both are average values measured with respect to a solder alloy having the same composition ten times) as the average value, and thus, there is a slight variation, but the values approximately correspond to the target value, that is, the values stay in the allowable range of 36 mass % (a concentration value ratio of 90.0%) to 43 mass % (a concentration value ratio of 107.5%). Then, in adhesive determination with respect to all of the samples, excellent results without any adhesive defect were obtained as with Embodiment 1, and thus, the results were determined as "excellent".

FIG. 8 is a characteristic curve diagram when a relationship between a Bi concentration (a curve Lc) in a plating liquid and a Bi concentration (a curve Ld) contained in a solder plating layer 16 in an electric plating treatment is set on the basis of a Cu core ball diameter, as with FIG. 6.

In this embodiment, a particle diameter of 215 μm was used as the initial value of the Cu ball, as with Embodiment 1. The thickness of the solder plating layer 16 was monitored one by one, and in this embodiment, the Cu core balls 10 when the thickness of the solder plating layer 16 gradually increases by a predetermined value were sampled as samples at each time. The sampled samples were washed, and dried, and then, particle diameters thereof were measured.

in the samples I to L, Bi indicates 2.81 mass % to 3.08 mass % (both are average values measured with respect to the same samples ten times), and thus, there is a slight variation (minimal average value of approximately 2.81 mass % (a concentration ratio of 93.7%) to maximal average value of 3.08 mass % (a concentration ratio of 102.7%), but these values are in an allowable range. Therefore, it is understood that Bi falls within a range of 2.7 mass % (a concentration ratio of 90.0%) to 3.2 mass % (a concentration ratio of 106.7%). In adhesive determination, excellent results without any adhesive defect were obtained as with Embodiment 1 and thus, the results were determined as "excellent".

The results of Embodiments 1 to 3 described above are collectively shown in Table 3. The concentration ratio of Bi is 91.4% mass % to 106.7 mass %.

TABLE 3

| | | Allowable Range | | | |
|---|---|---|---|---|---|
| | | Minimum | | Maximum | |
| | Target Value (Mass %) | Mass % | Concentration Ratio (%) [Mass %/Target Value] | Mass % | Concentration Ratio (%) [Mass %/Target Value] |
| Sn—58Bi | 58 | 53 | 91.4 | 63 | 108.6 |
| Sn—40Bi—0.5Cu—0.03Ni | 40 | 36 | 90 | 43 | 107.5 |
| Sn—3Ag—0.8Cu—3Bi | 3 | 2.7 | 90 | 3.2 | 106.7 |

In a case where the contents of Bi in the solder plating layer when the particle diameter of the Cu core ball at a measured timing was a target value were gradually measured, a result as illustrated by the curve Lc of FIG. 8 was obtained. From the result, it is determined that the content of Bi when the solder plating layer 16 gradually increases by a predetermined thickness is approximately the same value as the last content. In a case of the curve Lc, the content of Bi is approximately 40 mass % to 42 mass %. It is possible to understand that the concentration distribution of Bi is homogeneous (equable) with respect to the plating thickness, as with the curve Lc, and thus, there is no concentration gradient. The reason that the Bi concentration (the curve Lc) in the solder plating layer 16 is not coincident with the Bi concentration (the curve Ld) in the plating liquid is because Bi in the plating liquid is introduced into the solder plating layer prior to the Sn in the plating liquid, as with FIG. 6.

Embodiment 3

In Embodiment 3, the same measurement was performed with respect to a case where the solder plating layer 16 of a four-dimensional Sn-based solder alloy formed of (Sn-3Ag-0.8Cu-3Bi) containing Ag and a small amount of Bi was formed. The distribution of Bi in this case is 3 mass % as a target value, and is 2.7 mass % (concentration value ratio 90.0%) to 3.2 mass % (concentration ratio 106.7%) as an allowable range.

A preparation method of the Cu core balls was identical to that of Embodiments 1 and 2.

A specification such as the diameters of the used Cu ball and Cu core ball, and the film thicknesses of the Ni base plating layer and the solder plating layer, and the experimental condition were identical to those of Embodiment 1 except for the composition of the solder plating layer.

A result thereof is shown as samples I to L in (Table 2). In such a case, a target value of Bi is 3 mass %, but as shown Furthermore, an experiment result when the distribution of Bi in a well-known solder plating layer of the related art has a concentration gradient is shown in (Table 2) described above, as comparative examples. Spherical diameters of the used Cu ball and Cu core ball, film thicknesses of the Ni base plating layer and the solder plating layer, and the like, and an experiment condition were identical to those of Embodiment 1 except for an electric plating method.

Comparative Example 1

In Comparative Example 1, electric plating was performed by using a plating liquid containing methane sulfonic acid Sn, an organic acid, and a surfactant as the plating liquid. Then, in a stage where a plating film thickness is the half of the target value, only the methane sulfonic acid Bi was further added. Accordingly, the electric plating treatment was performed while decreasing the concentration of the methane sulfonic acid Sn in the plating liquid and increasing the concentration of the methane sulfonic acid Bi.

As a result thereof, a solder plating layer having a concentration gradient (the inner layer of 0 mass %, the interlayer of 52.12 mass %, and the outer layer of 100 mass %) in which the Bi concentration in the solder plating layer decreased as being directed towards an inner side and increased as being directed towards an outer side, and having the content of Bi in the entire solder plating layer of 58 mass % as a target value, was formed.

Comparative Example 2

In Comparative Example 2, electric plating was performed by using a plating liquid containing methane sulfonic acid Sn, methane sulfonic acid Bi, an organic acid, and a surfactant. The plating was started, and then, a predetermined direct current voltage was applied between the anode electrode and the cathode electrode, and the electric plating treatment was performed while oscillating the Cu balls.

As a result thereof, a solder plating layer having a concentration gradient (the inner layer of 70.7 mass %, the interlayer of 24.8 mass %, and the outer layer of 3.8 mass %) in which the Bi concentration in the solder plating layer increased as being directed towards the inner side and decreased as being directed towards the outer side, and having the content of Bi in the entire solder plating layer of 58 mass % as a target value, was formed.

As a result thereof, in Comparative Example 1, a positional shift occurred at the time of adhesion, and in Comparative Example 2, the Cu core ball was flicked off, and thus, both were determined as "defective".

As described above, in a case of changing the Bi concentration in the solder plating layer 16, a phenomenon such as a positional shift or flicking-off of the Cu core ball 10 occurred.

In the present invention, Bi contained in the material covered with the solder plating layer on the surface of the core is homogeneous. For example, in a semiconductor package such as a BGA, the core material according to the present invention can be used as a solder bump. A ball is preferable as a core, and a metal sphere of Cu or the like is preferable.

Furthermore, a technical range of the present invention is not limited to the embodiments described above, and includes various modifications with respect to the embodiments described above, within a range not departing from the gist of the present invention. The shape also includes a spherical body and other shapes (a columnar column, a sheet, or the like).

For example, a Cu core column including Cu column having diameters of an upper surface and a lower surface of 1 μm to 1000 μm, and a height of 1 μm to 3000 μm, an Ni base plating layer, an Fe base plating layer, a Co base plating layer, and/or the like of 1 μm to 4 μm on one side on a surface of a Cu column wherein in the same condition as that of the embodiments, the Cu core column is covered with an (Sn—Bi)-based solder plating layer has a concentration ratio of Bi in the solder plating layer in a predetermined range of 91.4% to 106.7%, and does not have an adhesive defect as with the Cu core balls of the embodiments of the present invention.

INDUSTRIAL APPLICABILITY

The core material according to the present invention is applicable to an adhesive material of a semiconductor package such as a BGA.

It is to be noted that any technical scope of the claims and/or meaning of term(s) claimed in the claims are not limited to the description in the above-mentioned embodiments. It should be understood by those skilled in the art that various modifications, combinations, sub-combinations and alterations may occur depending on design requirements and other factors insofar as they are within the scope of the appended claims or the equivalents thereof.

What is claimed is:
1. A core material, comprising:
a core; and
an electric solder plating layer of an (Sn—Bi)-based solder alloy made of Sn and Bi in an amount of a target content having a value in a range of 3 to 58 mass % on a surface of the core, wherein
the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more thereof, a metal oxide thereof, or a metal mixed oxide thereof, and
when a concentration ratio of Bi contained in the solder plating layer is set to

Concentration Ratio (%)=(Measured Value of Bi (mass %)/Target Bi Content (mass %))*100, or Concentration Ratio (%)=(Average Value of Measured Values of Bi (mass %)/Target Bi Content (mass %))*100, the concentration ratio is in a range of 91.4% to 106.7% across the entire electric solder plating layer.

2. The core material according to claim 1, wherein the core material further includes a base plating layer of one or more elements selected from the group of Ni and Co, between the surface of the core and the electric solder plating layer in this order.

3. The core material according to claim 2, wherein a Cu ball or a Cu column is used as the core.

4. The core material according to claim 1, wherein a Cu ball or a Cu column is used as the core.

5. A semiconductor package in which the core material according to claim 1 is used as a solder bump.

6. A core material, comprising:
a core; and
an electric solder plating layer of an (Sn-58Bi)-based solder alloy made of Sn and Bi in an amount of a target content of 58 mass % on a surface of the core, wherein
the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more thereof, a metal oxide thereof, or a metal mixed oxide thereof, and
when a concentration ratio of Bi contained in the solder plating layer is set to Concentration Ratio (%)=(Measured Value of Bi (mass %)/Target Bi Content (mass %))*100, or Concentration Ratio (%)=(Average Value of Measured Values of Bi (mass %)/Target Bi Content (mass %))*100, the concentration ratio is in a range of 91.4% to 108.6% across the entire electric solder plating layer.

7. The core material according to claim 6, wherein the core material further includes a base plating layer of one or more elements selected from the group of Ni and Co, between the surface of the core and the electric solder plating layer in this order.

8. The core material according to claim 7, wherein a Cu ball or a Cu column is used as the core.

9. The core material according to claim 6, wherein a Cu ball or a Cu column is used as the core.

10. A semiconductor package in which the core material according to claim 6 is used as a solder bump.

11. A core material, comprising:
a core; and
an electric solder plating layer of an (Sn-40Bi)-based solder alloy made of Sn and Bi in an amount of a target content of 40 mass % on a surface of the core, wherein
the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more thereof, a metal oxide thereof, or a metal mixed oxide thereof, and when a concentration ratio of Bi contained in the solder plating layer is set to Concentration Ratio (%)=(Measured Value of Bi (mass %)/Target Bi Content (mass %))*100, or Concentration Ratio (%)=(Average Value of Measured Values of Bi (mass %)/Target Bi Content (mass %))*100, the concentration ratio is in a range of 90% to 107.5% across the entire electric solder plating layer.

12. The core material according to claim 11, wherein the core material further includes a base plating layer of one or more elements selected from the group of Ni and Co, between the surface of the core and the electric solder plating layer in this order.

13. The core material according to claim 12, wherein a Cu ball or a Cu column is used as the core.

14. The core material according to claim 11, wherein a Cu ball or a Cu column is used as the core.

15. A semiconductor package in which the core material according to claim 11 is used as a solder bump.

16. A core material, comprising:
a core; and
an electric solder plating layer of an (Sn-3Bi)-based solder alloy formed of Sn and Bi in an amount of a target content of 3 mass % on a surface of the core, wherein
the core includes a metal simple substance of Cu, Ni, Ag, Bi, Pb, Al, Sn, Fe, Zn, In, Ge, Sb, Co, Mn, Au, Si, Pt, Cr, La, Mo, Nb, Pd, Ti, Zr, or Mg, or an alloy of two or more thereof, a metal oxide thereof, or a metal mixed oxide thereof, and
when a concentration ratio of Bi contained in the solder plating layer is set to Concentration Ratio (%)=(Measured Value of Bi (mass %)/Target Bi Content (mass %))*100, or Concentration Ratio (%)=(Average Value of Measured Values of Bi (mass %)/Target Bi Content (mass %))*100, the concentration ratio is in a range of 90% to 106.7% across the entire electric solder plating layer.

17. The core material according to claim 16, wherein the core material further includes a base plating layer of one or more elements selected from the group of Ni and Co, between the surface of the core and the electric solder plating layer in this order.

18. The core material according to claim 17, wherein a Cu ball or a Cu column is used as the core.

19. The core material according to claim 16, wherein a Cu ball or a Cu column is used as the core.

20. A semiconductor package in which the core material according to claim 16 is used as a solder bump.

* * * * *